United States Patent
Hiraishi et al.

[11] Patent Number: 5,932,008
[45] Date of Patent: Aug. 3, 1999

[54] APPARATUS FOR MANUFACTURING A SINGLE-CRYSTAL AND METHOD OF MANUFACTURING A SINGLE-CRYSTAL USING THE SAME

[75] Inventors: Yoshinobu Hiraishi; Koichi Shimomura, both of Kanagawa, Japan

[73] Assignee: Komatsu Electronic Metals Co., Ltd., Kanagawa, Japan

[21] Appl. No.: 08/874,729

[22] Filed: Jun. 13, 1997

[30] Foreign Application Priority Data

Jun. 13, 1996 [JP] Japan .................................. 8-188007

[51] Int. Cl.$^6$ ...................................... C30B 35/00
[52] U.S. Cl. .................. 117/217; 117/213; 117/218; 117/222; 117/911
[58] Field of Search ..................... 117/201, 202, 117/213, 217, 218, 222, 900, 911

[56] References Cited

U.S. PATENT DOCUMENTS

| 5,443,034 | 8/1995 | Everts | 117/208 |
| 5,450,814 | 9/1995 | Shiraishi et al. | 117/217 |

FOREIGN PATENT DOCUMENTS

| 000369626A1 | 5/1990 | European Pat. Off. . |
| 000449260 A3 | 10/1991 | European Pat. Off. . |
| 404321583 | 11/1992 | Japan . |

*Primary Examiner*—Felisa C. Hiteshew
*Attorney, Agent, or Firm*—Sughrue, Mion, Zinn, Macpeak & Seas, PLLC

[57] ABSTRACT

In this invention, three equally spaced and "L" shaped hooks 6B are rotatably supported on the upper peripheral wall of the body 6A of the seed holder 6 at pivots 6E. A radiation screen 7 is hung at the front ends of the hooks 6B via three engaging fixtures 6C affixed on its upper rim. The radiation screen 7 shaped like a hollow trancated cone, is used to surround the lower end of the single-crystal being lifted from the quartz crucible 3 which is disposed within the main chamber 1. According to the apparatus for manufacturing a single-crystal which can perform the descending or ascending movements of the radiation screen, the setting operation, and the lifting operation consecutively and automatically. Therefor the apparatus can enhance the productivity and avoid any problems with process automation, furthermore, it is compatible with conventional equipment.

6 Claims, 3 Drawing Sheets

APPARATUS FOR MANUFACTURING A SINGLE-CRYSTAL AND METHOD OF MANUFACTURING A SINGLE-CRYSTAL USING THE SAME

BACKGROUND OF THE INVENTION

1. Field of the Invention

The present invention relates to an apparatus for manufacturing a single-crystal (such as semiconductor single crystal) by primarily using the Czochralski Method (CZ method)and method of manufacturing a single-crystal using the same.

2. Description of Prior Art

A single crystal lift device provided with a radiation screen or a radiation shield is well known. However, before commencing the lifting operation, a required amount of polycrystalline silicon lumps as a raw material must be supplied into the crucible of the single crystal lift device, and the radiation screen becomes an obstacle to the melting operation of the polycrystalline silicon. This is due to the fact that the radiation screen causes excessive melting time for the polycrystalline silicon, or alternatively adds the lower heater to expedite the melting of polycrystalline silicon. This will increase the cost of single crystal production. To solve the above-mentioned problem, proposals, such as in unexamined Japanese Patent Publication Hei 3-279290 and Hei 7-010683, have been offered. The former discloses suspending parts that can be screwed upward and downward and which are disposed on an upper board of the chambers whereby the radiation screen is suspended in the chamber. The latter discloses a radiation shield that can be driven to ascend and descend and which is suspended over a crucible by a wire of predetermined length, wherein the radiation shield is positioned by an automatic positioning system. Furthermore, as disclosed in unexamined Japanese Patent Publication Hei 6-92772, during melting of raw material for single crystal, instead of a seed chuck, a radiation shield suspension fixture is disposed in a seed holder. The lower end portion of the radiation shield is engaged with and is pulled up in advance by the radiation shield suspension fixture. After the polycrystalline silicon lumps have been melted and before commencing the lifting operation, the radiation shield is disengaged with the radiation shield suspension fixture and the pressure within the chamber is brought back to that of the outside air, then the radiation shield suspension fixture is detached from the seed holder on which the seed chuck with crystal seed mounted thereon is thereafter installed.

However, in conventional devices, both in Hei 3-279290 and 7-010683, an extra mechanism for driving the radiation screen or shield upward and downward is required, resulting in increased complexity and cost of the device. Furthermore, in Hei 6-92772, after the radiation screen has been hooked at a predetermined location, it has to be elevated to approach the pull chamber, then the radiation shield suspension fixture must be swapped for the seed chuck by the operator in a normal atmosphere. Therefore, it takes about 30 minutes to cool down the fixtures accommodated within the pull chamber and to turn the environment into a low pressure argon atmosphere. Thus, the above device suffers from such problems as low efficiency and difficulty in process automation.

SUMMARY OF THE INVENTION

In view of the above-described defects, the object of the present invention is to provide an apparatus for manufacturing a single-crystal such that the apparatus itself can be constructed without intricacy and will not incur any problems, such as low efficiency or difficulty with automating the process. The single-crystal manufacturing device according to this invention is compatible with conventional equipment, and it is not necessary to swap the radiation shield suspension fixture for the seed chuck each time as previously. The descending and ascending movements of the radiation screen, the setting operation, and the lifting operation can be performed in an automatic and sequential way.

To achieve the above object, according to this invention, in an apparatus for manufacturing a single-crystal, including a hollow radiation screen disposed around the single-crystal lift zone above the crucible and surrounding the lower end of the single-crystal being lifted within the chamber; and a seed holder on which a crystal seed is mounted, a hook is provided, which is capable of securing the hollow radiation screen on the seed holder in a suspended manner.

Furthermore, the hook is retained on the seed holder so that it can swing freely with respect to the seed holder, and an engaging fixture is provided in the radiation screen for engaging with the hook of the seed holder. The engaging fixture can be constructed so as to swing freely with respect to the radiation screen. It is preferable to avoid interference between the engaging fixture of the radiation screen and the hook of the seed holder when they have been disengaged.

In the apparatus for manufacturing a single-crystal according to this invention, due to the fact that the seed holder is provided with a hook capable of securing the radiation screen in a suspended manner, the radiation screen can be raised above the crucible when raw material for single crystal is being fed into the crucible and heating or melting is being proceeded. By this arrangement, the interference between raw material for forming single crystals and the lower end of the radiation screen can be avoided, and therefore feeding a predetermined amount of raw material into the crucible can be easily accomplished. Furthermore, when the melting of raw material is nearly finished, the seed holder descends and the hook disengages with the radiation screen to commence the lifting operation for single crystals.

A method of manufacturing a single-crystal using the apparatus of the present invention, comprises steps of: engaging a hook with the hollow radiation screen on the seed holder in a suspended manner; lifting the hollow radiation screen by lifting the seed holder; feeding a raw material into a crucible; heating the raw material in the crucible into a melt; descending the seed holder to release a engagement between the hook and the hollow radiation screen so that the hollow radiation screen is disposed surrounding the crucible and to immerse a seed crystal retained on the lower end of the seed holder into the melt; and lifting the seed crystal so as to grow a single-crystal.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
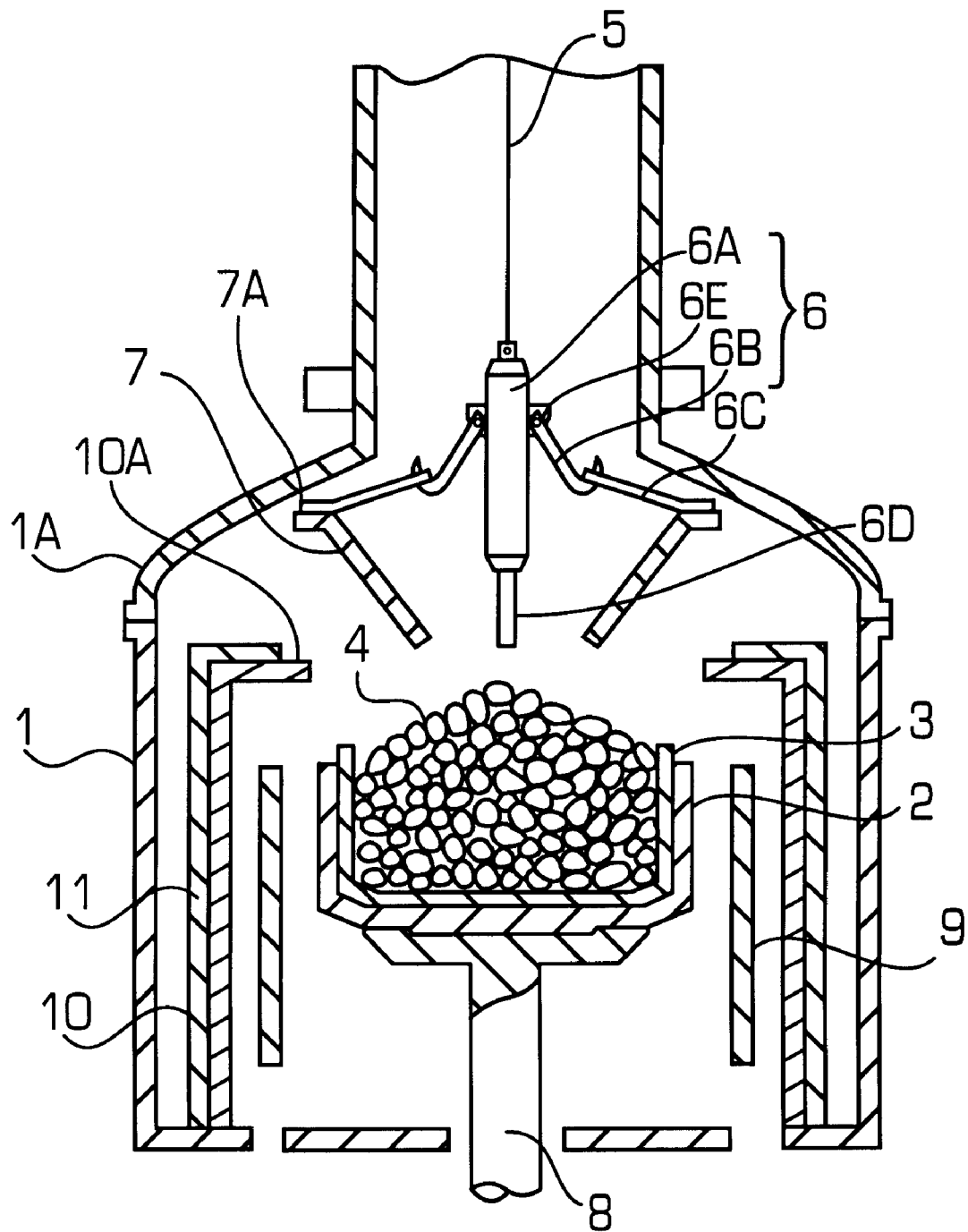
FIG. 1 is a schematic diagram showing the apparatus for manufacturing a single-crystal according to this invention, wherein polycrystalline silicon lumps have been fed into a quartz crucible.
Figure 2:
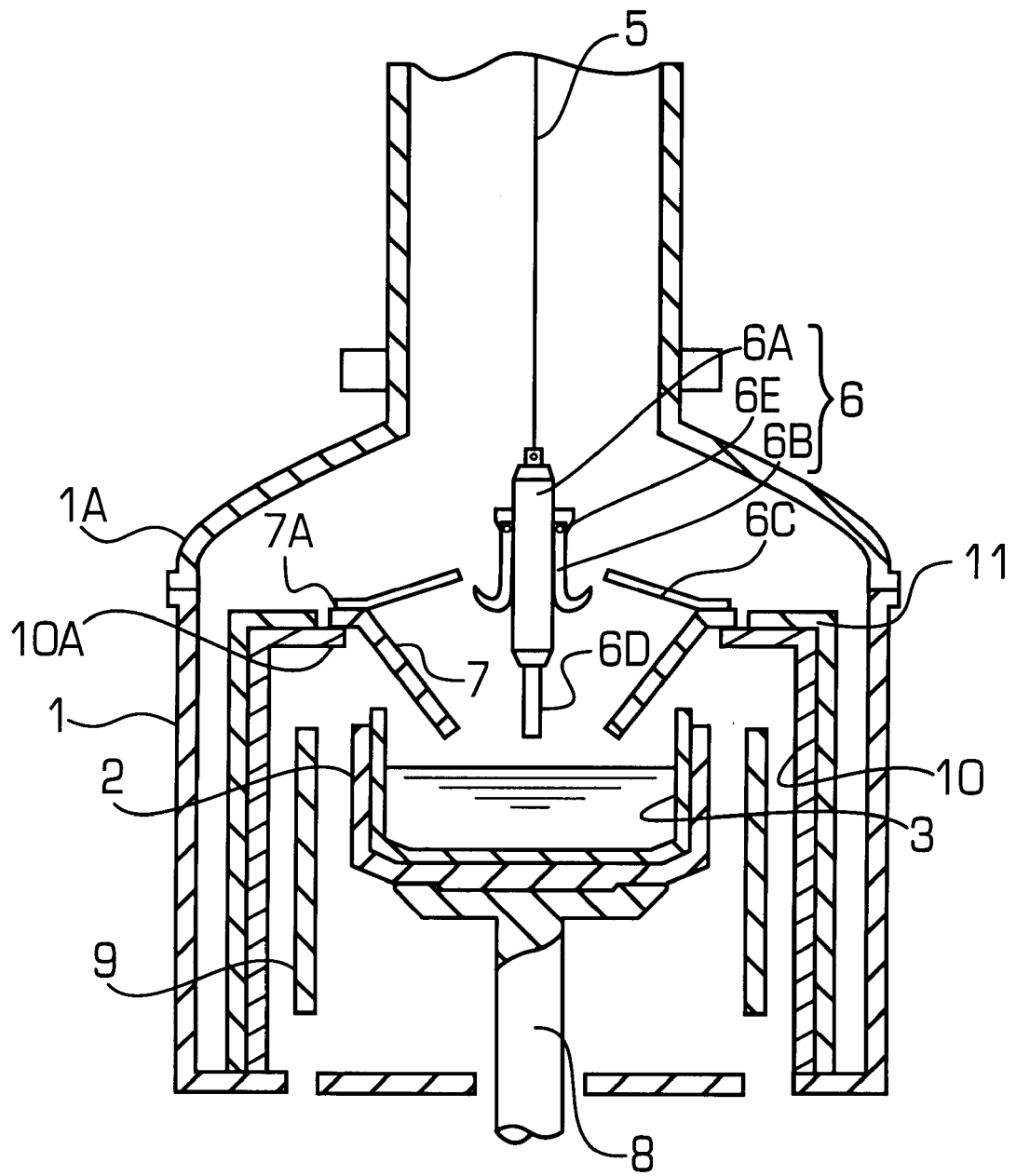
FIG. 2 is a schematic diagram showing the apparatus for manufacturing a single-crystal according to this invention, wherein the radiation screen is hooked on an adiabatic cylinder.
Figure 3:
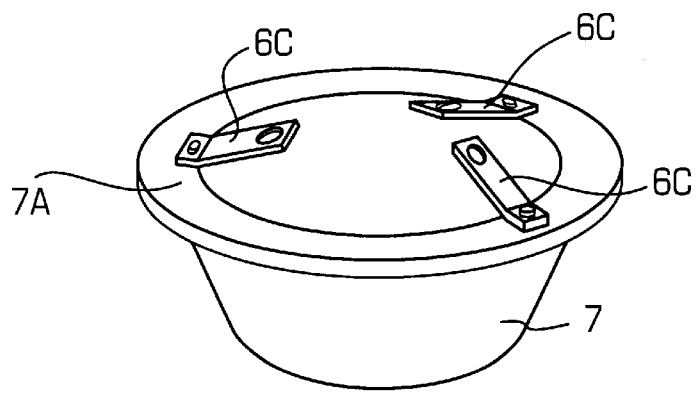
FIG. 3 is a perspective view showing the structure of the radiation screen according to this invention.

The numeral 1 shown in the drawings denotes a main chamber of an apparatus for manufacturing a single-crystal by using the Czochralski Method. As shown in FIGS. 1 and 2, a graphite crucible 2 is installed rotatably around a crucible axis 8 within the chamber 1, and a quartz crucible 3 is embedded within the graphite crucible 2. Polycrystalline silicon lumps 4 employed as the raw material for single-crystal are fed into the quartz crucible 3. A pull chamber erectly extends from the upper chamber 1A, pull-up axis 5 made of stainless steel wire or tungsten wire is suspended from the upper end of the pull chamber and hangs over the quartz crucible 3. A seed crystal 6D is retained by a seed holder 6, and the body 6A of the seed holder 6 is suspended on the lower end of the pull-up axis 5. The seed holder 6 is kept rotating and ascending during the lifting operation of single-crystal. As shown in FIG. 1, three equally spaced hooks 6B, which are made of heat-resistance molybdenum alloy and shaped like an "L", are rotatably supported at their respective rear ends by three pivots made of heat-resistance molybdenum alloy on the upper peripheral wall of the body 6A of the seed holder 6. Furthermore, a radiation screen 7 is suspended at the front ends of the hooks 6B via three engaging fixtures 6C made of heat-resistance molybdenum alloy and affixed on its upper rim (see FIG. 3). The radiation screen 7, being shaped like a hollow trancated cone, is used to surround the lower end of the single-crystal being lifted from the quartz crucible 3 which is disposed within the main chamber 1. Under such circumstances, the height of the seed holder 6 is adjusted so that the clearance between the upper end of the radiation screen 7 and the inner wall of the upper chamber 1A is approximately within thirty or forty mm. As shown in FIG. 1, due to the fact that an enough space can be taken between the upper end of the quartz crucible 3 and the lower end of the radiation screen 7, the amount of the raw material 4 to be fed into the quartz crucible 3 can be determined at a wide discretion.

A carbon heater 9 is disposed around the graphite crucible 2 with a predetermined distance apart from each other, and a protection cylinder 11, whose inner wall is embedded with an adiabatic cylinder 10 made of graphite, is in addition surrounding the carbon heater 9 at a predetermined distance apart from each other. A step portion 10A is formed between the upper flange of the protection cylinder 11 and the upper flange of the adiabatic cylinder 10. By this arrangement, as shown in FIG. 2, on the occasion that the seed holder 6 is driven to descend to let the outer flange 7A of the radiation screen 7 rest on the step portion 10A, the engaging fixtures 6C will be released from the hooks 6B if the seed holder 6 is further driven to descend. The released hooks 6B will thus turn down to lean on the body 6A of the seed holder 6 by their own weight, and no interference will occur between the engaging fixtures 6C and the hooks 6B. By this, the following operation of single-crystal lifting can be easily performed.

Figure 4:
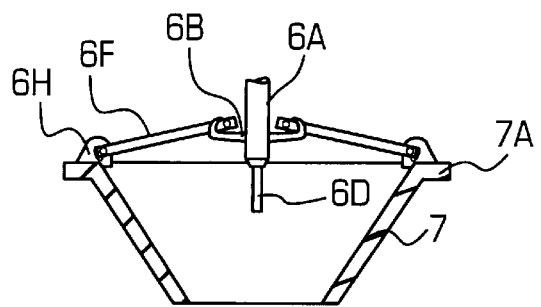
FIG. 4 is a schematic diagram showing part of the structure of another example of the apparatus for manufacturing a single-crystal according to this invention, wherein the radiation screen is hooked on the seed holder.
Figure 5:
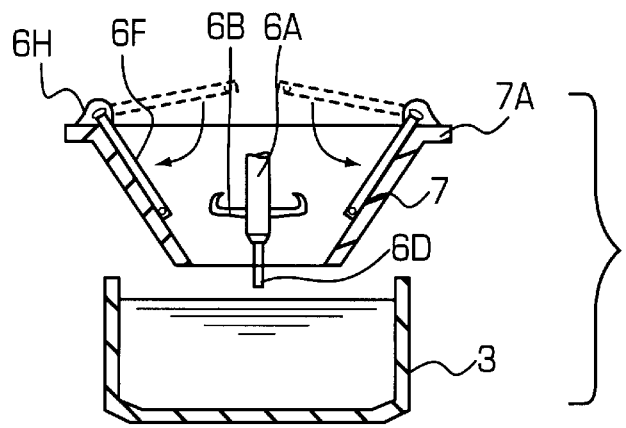
FIG. 5 is a schematic diagram showing the structure of another example of the apparatus for manufacturing a single-crystal according to this invention, wherein the radiation screen is disengaged with the seed holder.

Alternatively, as shown in FIGS. 4 and 5, the hooks 6B made of heat-resistance molybdenum alloy can be formed integrally with the body 6A of the seed holder 6, and instead of the engaging fixtures 6c, three engaging fixtures 6F can be used. The engaging fixtures 6F are rotatably supported at pivots 6H made of heat-resistance molybdenum alloy, which are affixed to the radiation screen 7. After the seed holder 6 has descended to a location where the outer flange 7A of the radiation screen 7 rests on the step portion 10A, the engaging fixtures 6F will gradually turn down by their own weight to lean on the inner wall of the radiation screen 7 and the hooks 6B will disengage with the engaging fixtures 6F if the seed holder 6 continues descending. Likewise, after the disengagement of the hooks 6B and the engaging fixtures 6F, no interference will occur between the engaging fixtures 6F and the hooks 6B.

In those embodiments described above, the hooks 6B used for engaging the radiation screen 7 is designed as a three-point support structure consisting of three forks extending outward from the body 6A of the seed hold 6. Nevertheless, it goes without saying that the structure of the hooks 6B is not limited to that described above, any structure capable of keeping the radiation screen 7 with the body 6A of the seed holder 6 in a stable manner could also be used for this purpose. Furthermore, although all of the hooks 6B, the engaging fixtures 6C, and the pivots 6E are made of heat-resistance molybdenum alloy, other materials such as tungsten, tantalum, ceramics, carbon, or those coated with SiC or SiN could also be used for this purpose. Moreover, it is possible to omit the engaging fixtures 6C and to retain the lower end of the radiation screen 7 directly by the hooks 6B.

The following is an explanation of the operation of the single-crystal manufacturing device according to this invention. As shown in FIG. 1, in the preparation of manufacturing single-crystals, the hooks 6B of the seed holder 6 are engaged with the radiation screen 7, and the raw material 4 for single-crystal is fed into the quartz crucible 3. The raw material 4 is soon afterward heated by the carbon heater 9. After the raw material 4 has completely melted, the seed holder 6 is driven to gradually descend so as to rest the radiation screen 7 on the step portion 10A of the adiabatic cylinder 10. While the seed holder 6 descends still more, the hooks 6B disengage with the engaging fixture 6C, and no more interference occurs between them. If the seed holder 6 continues going down, the seed crystal will contact the melt liquid of the raw material, and the lifting operation of single-crystals can be proceeded.

The structure of this invention has been disclosed as above described, in which hooks used for engaging the radiation screen with the seed holder are provided, and it is not necessary to swap the radiation screen for the seed chuck through manual operation by a human operator as previously. Hence, consecutive processes, commencing from the descending or ascending movements of the radiation screen and the setting operation to the lifting operation, can be performed rapidly and efficiently in an automatic manner. Furthermore, the single-crystal manufacturing device itself can be constructed without intricacy and will not cause any problems, such as low efficiency and difficulty with process automation. In addition, the apparatus for manufacturing a single-crystal according to this invention is compatible with conventional equipment.

What is claimed is:

1. An apparatus for manufacturing a single-crystal, comprising:
    a hollow radiation screen disposed around a single-crystal lift zone above a crucible and surrounding a lower end of the single-crystal being lifted within a chamber;

a seed holder on which a crystal seed is mounted; and a hook capable of securing an engagement of the hollow radiation screen on the seed holder in a suspended manner so that the hollow radiation screen can be ascended by ascending the seed holder and releasing the engagement after setting the hollow radiation screen.

2. The apparatus for manufacturing a single-crystal as claimed in claim 1, wherein the hook is retained on the seed holder so that it can swing freely with respect to the seed holder.

3. The apparatus for manufacturing a single-crystal as claimed in claim 1, wherein an engaging fixture is provided in the radiation screen for engaging with the hook of the seed holder.

4. The apparatus for manufacturing a single-crystal as claimed in claim 3, wherein the engaging fixture is constructed to be able to swing freely with respect to the radiation screen.

5. The apparatus for manufacturing a single-crystal as claimed in claims 2 or 4, wherein the engaging fixture of the radiation screen and the hook of the seed holder are designed to avoid any interference between them after their disengagement.

6. A method of manufacturing a single-crystal comprising steps of:

engaging a hook with the hollow radiation screen on the seed holder in a suspended manner;

lifting the hollow radiation screen by lifting the seed holder;

feeding a raw material into a crucible;

heating the raw material in the crucible into a melt;

descending the seed holder to release a engagement between the hook and the hollow radiation screen so that the hollow radiation screen is disposed surrounding the crucible and to immerse a seed crystal retained on the lower end of the seed holder into the melt; and lifting the seed crystal so as to grow a single-crystal.

* * * * *